United States Patent [19]

Matsui et al.

[11] Patent Number: 5,277,539
[45] Date of Patent: Jan. 11, 1994

[54] SUBSTRATE CONVEYING APPARATUS

[75] Inventors: Shin Matsui, Atsugi; Takao Kariya, Hino; Nobutoshi Mizusawa, Yamato; Ryuichi Ebinuma, Kawasaki; Shunichi Uzawa, Tokyo, all of Japan

[73] Assignee: Canon Kabushiki Kaisha, Tokyo, Japan

[21] Appl. No.: 58,791

[22] Filed: May 10, 1993

Related U.S. Application Data

[63] Continuation of Ser. No. 821,137, Jan. 16, 1992, abandoned, which is a continuation of Ser. No. 414,272, Sep. 29, 1989, abandoned.

[30] Foreign Application Priority Data

Sep. 30, 1988 [JP] Japan .................. 63-246263
Sep. 30, 1988 [JP] Japan .................. 63-246264

[51] Int. Cl.⁵ ............................................. B65G 47/24
[52] U.S. Cl. ................................. 414/735; 414/728; 414/331; 414/416; 414/730; 414/273; 414/281; 414/225; 414/752
[58] Field of Search ............... 414/783, 754, 331, 277, 414/273, 274, 281, 282, 416, 417, 222, 225, 226, 730, 735, 917, 737, 752, 753, 751; 901/46, 47, 40; 364/478

[56] References Cited

U.S. PATENT DOCUMENTS

| | | | |
|---|---|---|---|
| 3,247,979 | 4/1966 | Melton et al. | 414/728 X |
| 3,255,893 | 6/1966 | Hainer et al. | 414/728 |
| 3,884,365 | 5/1975 | Thomson | 414/728 X |
| 4,770,590 | 9/1988 | Huques et al. | 414/331 X |
| 4,803,373 | 2/1989 | Imamura et al. | 414/331 X |
| 4,846,626 | 7/1989 | Engelbrecht | 414/416 X |
| 4,886,412 | 12/1989 | Wooding et al. | 414/416 |

FOREIGN PATENT DOCUMENTS

| | | |
|---|---|---|
| 0244202 | 11/1987 | European Pat. Off. |
| 0244950 | 11/1987 | European Pat. Off. |
| 0246453 | 11/1987 | European Pat. Off. |
| 0253162 | 1/1988 | European Pat. Off. |
| 0278490 | 8/1988 | European Pat. Off. |
| 252535 | 12/1985 | Japan .................. 414/331 |
| 273441 | 12/1986 | Japan .................. 414/416 |
| 763082 | 9/1980 | U.S.S.R. .................. 414/735 |
| 906685 | 2/1982 | U.S.S.R. .................. 414/730 |

Primary Examiner—Frank E. Werner
Attorney, Agent, or Firm—Fitzpatrick, Cella, Harper & Scinto

[57] ABSTRACT

A substrate conveying apparatus usable with a semiconductor manufacturing apparatus wherein a pattern of a mask is transferred onto a semiconductor wafer by exposing the semiconductor wafer to synchrotron orbital radiation or other exposure energy through a mask. The conveying apparatus transfers the semiconductor wafer to and from a wafer chuck while the surface thereof extends vertically, and/or transfers the wafer to and from a wafer cassette which contains a plurality of wafers horizontally. The apparatus includes a conveying hand having a gimbal mechanism for supporting the semiconductor wafer to assure the semiconductor wafer transfer to and from the wafer chuck while the wafer is vertical. When the semiconductor wafer is transferred to and from a wafer cassette, the apparatus is provided with a correcting mechanism for correcting the attitude of the conveying hand to prevent the semiconductor wafer from contacting the wafer cassette.

9 Claims, 4 Drawing Sheets

SUBSTRATE CONVEYING APPARATUS

This application is a continuation of prior application Ser. No. 07/821,137 filed Jan. 16, 1992, which application is a continuation of prior application, Ser. No. 07/414,272 filed Sep. 29, 1989, both now abandoned.

FIELD OF THE INVENTION AND RELATED ART

The present invention relates to a substrate conveying apparatus for conveying a substrate such as a semiconductor wafer in a semiconductor manufacturing apparatus, and more particularly to a substrate conveying apparatus for transferring a substrate to a substrate stage while it is maintained vertically, that is, while the surface of the substrate extends vertically, and/or a substrate conveying apparatus for picking up a substrate from and returning it to a substrate cassette for accommodating substrates horizontally.

In an X-ray exposure apparatus using, as an exposure energy source, synchrotron orbital radiation, as contrasted to a conventional exposure apparatus, a wafer and a mask are situated vertically, that is, the surface of the wafer and the mask are parallel to an X-Y plane in X-Y-Z coordinates in which the Y axis is vertical. In such an X-ray exposure apparatus, the wafer conveying system must match the vertical X-Y stage. However, systems for such vertical arrangement have not been developed well. On the other hand, in the wafer conveying system, the problem of foreign matter becomes more significant due to the demand for the reduction of the linewidth of the pattern to be transferred for the semiconductor devices, and therefore, a proposal has been made wherein a back side of the wafer is attracted by a conveying hand.

FIGS. 1A and 1B show a conventional conveying apparatus of a vertical type wherein the wafer is attracted at its back side. FIG. 1A is a top plan view, and FIG. 1B is a front view, wherein the Y axis extends vertically. Reference numeral 1 designates a wafer. The apparatus comprises a conveying hand 12 for attracting and conveying the wafer 1, a wafer chuck 13 for supporting the wafer 1, a parallel link mechanism 4 to which the conveying hand 12 is mounted, a block 14 to which the parallel link mechanism 4 is mounted and a Z-stage 15 movable in the Z axis direction.

The wafer chuck 13 has a size smaller than the wafer 1 to permit the conveying, hand 12 to attract the backside of the wafer 1. In addition, the conveying hand 12 does not interfere with the wafer chuck 13, but is still capable of attracting the wafer 1. Therefore, the wafer attracting areas and the attracting forces of the conveying hand 12 and the wafer chuck 13 are determined in consideration of them together.

In the above-described structure, when the wafer 1 supported by the conveying hand 12 is to be mounted on the wafer chuck 13, the Z-stage 15 is driven to a mounting position, while the position of the conveying hand 12 is being checked by an unshown sensor. At this time, the conveying hand 12 slightly presses the wafer 1 to the wafer chuck 13. Then, the attracting force of the wafer chuck 13 is produced, by which the wafer 1 is attracted on the wafer chuck 13. Subsequently, the attraction force by the conveying hand 12 is removed, by which the wafer 1 transfer is completed.

SUMMARY OF THE INVENTION

However, in the conventional vertical conveying system wherein the wafer is attracted at its backside, the following problems arise with the result that it is difficult to assure that the wafer is conveyed to the stage:

(1) When the wafer 1 attracted at its backside is transferred to the wafer chuck 13 which also attracts the backside of the wafer 1, the parallelism has to be accurately established between the wafer attracting surface of the conveying hand 12 and the wafer supporting surface of the wafer chuck 13, since otherwise, the wafer 1 is not transferred to the wafer chuck 13, or it is transferred with an angular deviation:

(2) Since all the attractions are effected to the backside of the wafer, the conveying hand 12 has to have a large attraction force, and a larger attracting area thereof is desired: however, in order to assure a sufficient attracting area of the wafer chuck 13, it is difficult to increase the attraction area of the conveying hand 12.

Accordingly, it is a principal object of the present invention to provide a conveying apparatus for conveying a substrate such as a wafer wherein the substrate can be reliably and assuredly conveyed.

According to an embodiment of the present invention, a substrate attracting means of a conveying hand for attracting and conveying the substrate such as a wafer includes a gimbal supporting mechanism, wherein supporting shafts of the gimbal supporting mechanism are on a substrate receiving surface of the substrate supporting means such as a wafer chuck or the like.

Then, even if the substrate is slightly inclined when the substrate is transferred from the conveying hand to the substrate supporting means, the attitude of the substrate supported on the gimbal supporting mechanism is corrected to follow the substrate receiving surface when the substrate is pressed to the substrate receiving surface of the substrate supporting means.

It is preferable that at least a part of the substrate receiving surface of the substrate supporting means extends from the center of the substrate receiving surface beyond a supporting shaft of the gimbal supporting mechanism. As an example, the extension is in the form of a projection from a part of a circular receiving surface. By doing so, an angular deviation between the surface of the substrate attracted by the conveying hand and the substrate receiving surface of the substrate supporting means is accommodated with certainty. In addition, the substrate attracting area of the conveying hand is increased.

On the other hand, in a conventional wafer conveying system for manufacturing semiconductor devices, the dimensional accuracy is not very good in the wafer cassette, and in addition, the conveying hand is not positioned with high precision, with the result of difficulty in picking a wafer up from a wafer cassette and returning it into the wafer cassette without contacting a portion of the wafer cassette. Actually, in the conventional wafer conveyance, it is accepted as being unavoidable that the wafer is slides on the wafer cassette with the result of the production of dust, because the contact between the wafer and the wafer cassette is not a significant problem in the conventional system.

However, with the recent improvement in the fine pattern production technique using pattern exposure in semiconductor manufacturing, the production of dust by the sliding contact between the wafer and the wafer cassette becomes a significant problem, because the dust leads to a decrease in the yield of the semiconductor device manufacturing.

Accordingly, it is another object of the present invention to provide a conveying system wherein the contact between the substrate and the accommodating means is prevented when the substrate is picked up from the accommodating means or is returned thereinto, so that dust production thereby is prevented.

According to an embodiment of the present invention, an attitude correcting means is provided between the substrate accommodating portion for accommodating the substrates and a conveying hand for transferring the substrate to and from the substrate accommodating portion. When the substrate is picked up from the accommodating portion and is returned thereinto, the attitude of the conveying hand is corrected by the correcting means so that the substrate and the conveying hand are maintained out of contact with the substrate accommodating portion.

By doing so, when the wafer or another substrate is transferred to and from the substrate accommodating portion such as a wafer cassette, the attitude or pose of the conveying hand is corrected to a predetermined attitude immediately before the substrate accommodating portion. Therefore, the substrate can be handled without contact with the substrate accommodating portion.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Figure 1A:
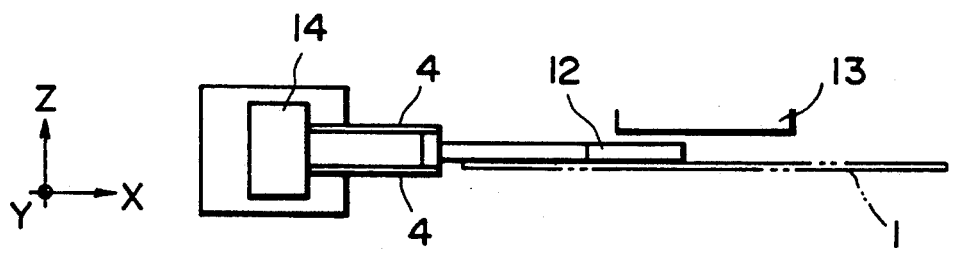
FIGS. 1A and 1B are a top plan view and a front view of a conventional conveying system.
Figure 1B:
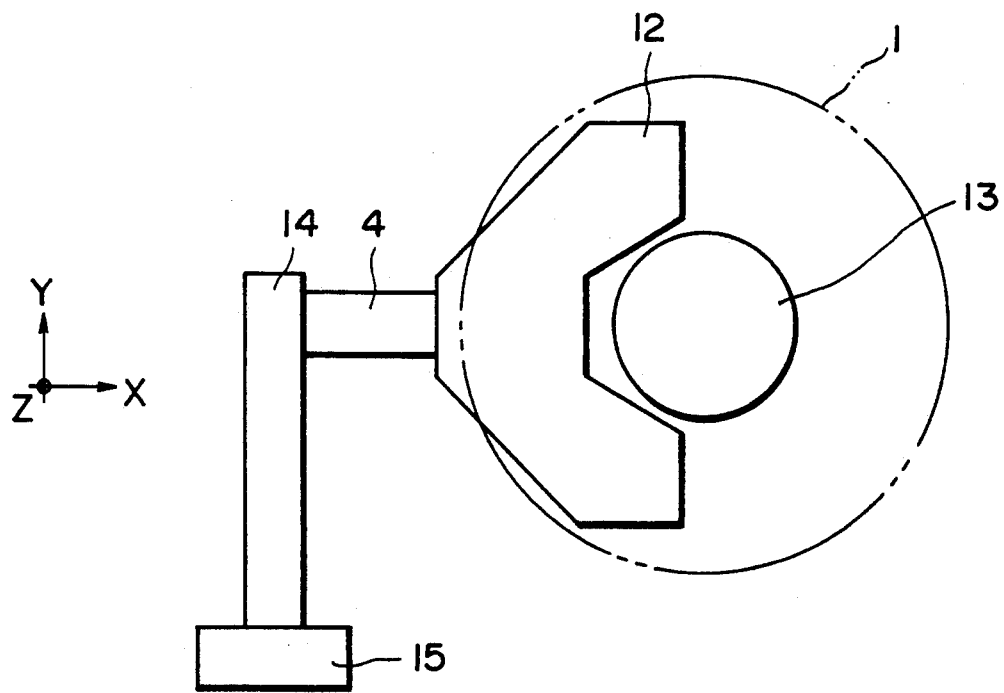
Figure 2A:
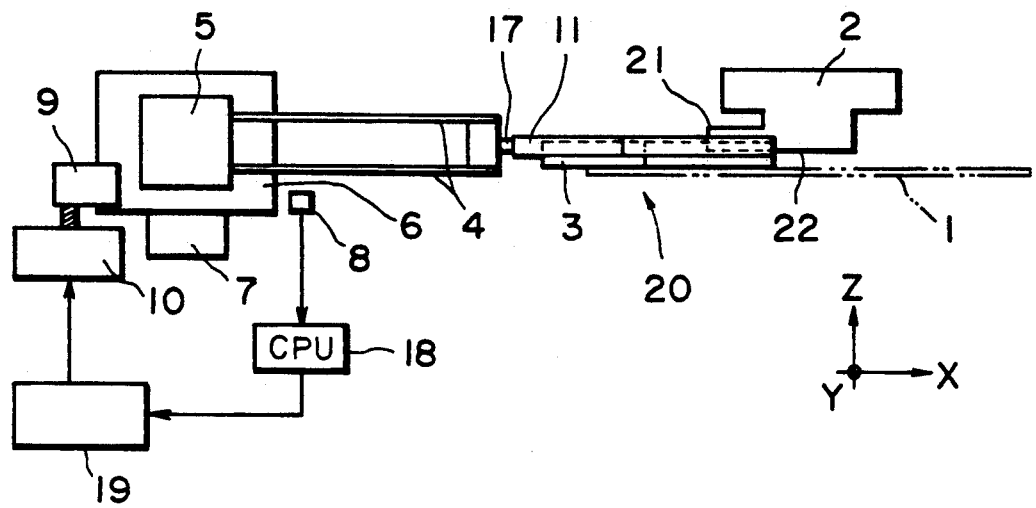
FIGS. 2A and 2B are a top plan view and a front view of a conveying apparatus according to an embodiment of the present invention.
Figure 2B:
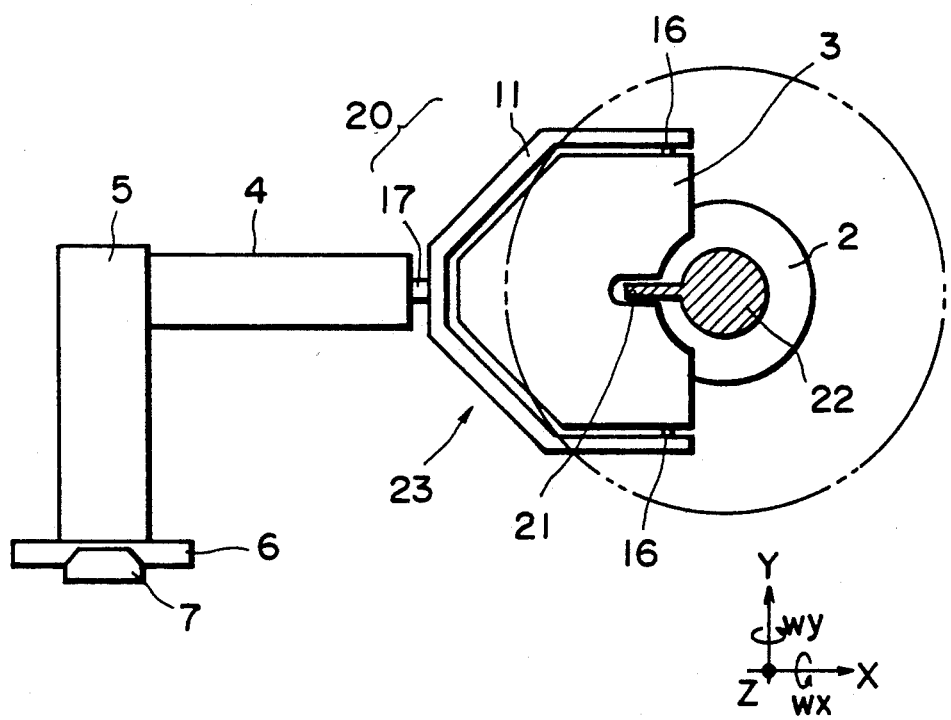

Referring to FIGS. 2A and 2B, there is shown a conveying apparatus according to an embodiment of the present invention. FIG. 2A is a top plan view, and FIG. 2B is a front view, wherein a Y axis extends vertically. In the Figures, reference numeral 1 designates a wafer.

The apparatus comprises a wafer chuck 2, an operating hand 3 for attracting and supporting a backside of the wafer 1, stage rails 7 and a stage 6 on the stage rails 7 with latitude in the Z axis direction. The apparatus further comprises a fixed block 5 on the stage 6, a parallel link mechanism 4 mounted on the fixed block 5 extending along the X axis (horizontally), and a conveying and attracting hand 20 to the free end of the parallel link mechanism 4 with latitude in the Z axis direction. The attracting hand 20 has a gimbal mechanism 23. The conveying attraction hand which will hereinafter be called "conveying hand" 20 including the gimbal mechanism 23 is constituted mainly by an operating hand 3 having a wafer attracting function, a rotatable supporting hand 11 having a generally V-shape, a Wy rotation shaft 16 mounted to lateral ends of the rotatable supporting hand 11 and extending parallel to the Y axis and a Wx rotation shaft 17 mounted to a free end side of the parallel link 4 and extending parallel to the X axis. The positions of the rotation shafts 16 and 17 are adjusted so that they are the same in the Z axis direction, that is, a plane including rotational center axes of the rotation shafts 16 and 17 is substantially parallel to the X-Y plane. The operating hand 3 is freely rotatable in the direction Wy relative to the rotational supporting hand 11 by the rotation shaft 16, and the rotatable supporting hand 11 is freely rotatable in the direction Wx relative to the parallel link mechanism 4 by the rotation shaft 17. Therefore, the operating hand 3 is freely rotatable in both the directions Wx and Wy about the rotation shafts 16 and 17 relative to the parallel link mechanism 4. The operating hand is inside the rotatable supporting hand 11.

The conveying apparatus further includes a ball screw 9 and an actuator 10. The movement of the actuator 10 is converted into a rectilinear movement in the Z axis direction by the ball screw to drive the stage 6 in the Z axis direction. A sensor 8 is provided to be rendered on or off photoelectrically when the stage 6 is driven to a predetermined position in the Z axis direction. The apparatus further includes a CPU (central processing unit) 18 and a driver 19 for the actuator 10.

The wafer 1 is transferred to the chuck 2. The chuck 2 is provided with a projection 21 having the same level surface (the Z axis direction) as the chucking surface. The projection 21 extends in the X axis direction from the outer periphery of the chuck 2. The wafer supporting surface (attracting surface) includes the chucking surface and the surface of the projection, as indicated by hatched lines 22.

The operation will be described as to the wafer 1 transfer from the conveying hand 20 to the wafer chuck 2. The stage 6 is driven in the Z axis direction by the actuator 10 to advance the conveying hand 20 to such an extent that the backside of the wafer 1 is not contacted with the receiving surface 22 of the wafer chuck 2. At this position, the light to the sensor 8 is blocked. The CPU 18, in response to the light blocking of the sensor 8, instructs the driver 19 to produce predetermined pulses. The driver 19 supplies the predetermined pulses to the actuator 10, by which the stage 6 is further advanced through a predetermined distance in the Z axis direction from the position where the light to the sensor 8 is blocked. The predetermined pulses are so determined that the conveying hand 20 is advanced through several hundreds of microns in the Z axis direction beyond the receiving surface 22 of the chuck 2, from the position where the light to the sensor 8 is blocked.

In this manner, the actuator 10 urges the conveying hand 20 to press the wafer 1 to the chuck 2 in response to the instructions of the CPU 18. At this time, the gimbal mechanism 23 of the conveying hand 20 accommodates the angular deviation between the surface of the operating hand 3 supporting the wafer 1 and the attracting surface 22 of the chuck 2. This is because, due to the gimbal mechanism 23 of the conveying hand 20 mounted to the parallel link 4, the operating hand 3 has rotational latitude in the direction Wx about the Wx rotation shaft 17 and also, rotational latitude in the direction Wy about the Wy rotation shaft 16.

In order for the gimbal mechanism 23 to operate correctly, when the backside of the wafer 1 supported on the operating hand 3 is pressed to the attracting surface 22 of the wafer chuck 2, the Wx and Wy rotation shafts 16 and 17 are required to be overlapped with the attracted surface 22 of the wafer chuck 2. In other words, a line extended from the rotational shaft 16 in the Y axis direction in the X-Y plane, crosses a substantially central portion of the attracting surface 22, and a line extended from the rotation shaft 17 in the X axis direction, crosses substantially a central portion of the attracting surface 22. If the extensions in the X-Y plane of the rotation shafts 16 and 17 are outside the attracting surface 22 of the wafer chuck 2, the wafer 1 is rotated away from the attracting surface 22 without correcting the attitude along the attracting surface 22, when the backside of the wafer 1 is pressed to the attracting surface 22 of the wafer chuck 2.

On the other hand, the operating hand 3 conveys the wafer 1 while supporting or attracting it, and therefore, it is subjected to acceleration or impact. It is, therefore, desirable that the operating hand 3 has an attraction force which is larger than that of the chuck 2. In other words, the hand 3 preferably has an attracting area which is larger than the attracting area of the chuck 2.

In order to overlap the extensions, in the X-Y plane, of Wx and Wy rotation axes 16 and 17 with the attracting surface 22 of the chuck 2, it will be achieved by increasing the diameter of the attracting surface 22 of the chuck 2. Then, however, the attracting surface of the operating hand is reduced correspondingly, with the result of an insufficient attraction force thereof.

In this embodiment, in order to satisfy the two requirements, the projection 21 shown in FIGS. 2A and 2B are provided having the same level surface as the chuck 2 attracting surface 22 in the Z axis direction. By the projection 21, the area of the attracting surface 22 can be made minimum, and Wy rotation axis 16 is prevented from being outside the attracting surface 22 of the chuck 2, because the extension, in the Y axis direction, of Wy rotation axis 16 is overlapped with the projected portion 21. When the wafer 1 is pressed to the chuck 2, the attitude of the wafer 1 is corrected to follow the attracting surface 22 of the chuck 2, since the extension, in the Y axis direction, of the Wy rotation axis 16 is overlapped with the attracting surface 22 of the chuck 2 by the provision of the projection 21. In addition, since the area of the attracting surface 22 is reduced, the attracting surface of the operating hand 3 has a larger and sufficient attracting area by the attracting area of the chuck 2.

After the operating hand 3 is pressed to the chuck 2 so that the backside of the wafer 1 and the attracting surface of the chuck 2 are contacted, the attraction by the chuck 2 is started. Subsequently, the attracting action of the operating hand 3 is stopped, by which the transfer of the wafer 1 is completed.

As described, according to this embodiment, the conveying hand includes the gimbal supporting mechanism, and the supporting or receiving surface of the substrate supporting means is provided with a projection in the form of a square rod, and therefore, the substrate is prevented from falling during conveyance and is transferred with certainty and reliability. In addition, since the structure is simple, assembly of the apparatus is easy.

Figure 3:
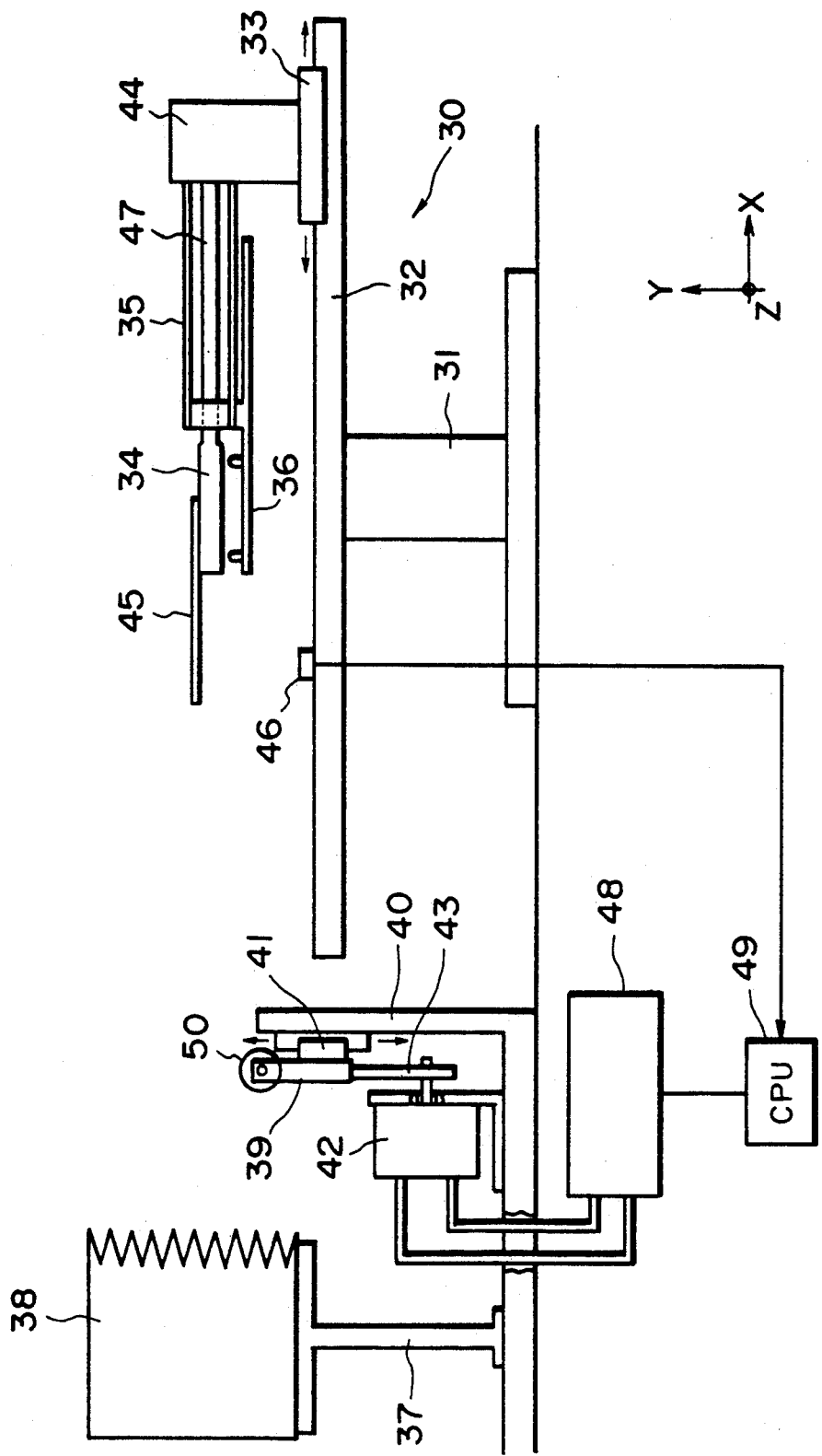
FIG. 3 is a side view of a conveying apparatus according to another embodiment of the present invention.

Referring to FIG. 3, there is shown a conveying apparatus according to another embodiment of the present invention, in a side view. In this Figure, the Y axis also extends vertically.

The apparatus comprises a base 32 rotatable about an axis parallel to the Z axis by a rotating table 31, a stage 33 movable rectilinearly in a horizontal plane (Z axis direction in this Figure) on the base 32, a fixed block 44 fixed on the linear movement stage 33 and an attracting hand 34 for attracting a wafer 45 and for transferring the wafer 45 to and from a wafer cassette 38. The attracting hand is supported on an elastic member 47 fixed on the fixed block 44. The apparatus further comprises a hand locking plate 36 having three pins projecting out in the Y axis direction to correct the attracting surface of the attracting hand 34 and a parallel link mechanism 35 for moving the hand locking plate 36 up and down (Y axis direction) parallel to the attitude initially set. The hand locking plate 36 is fixed to the parallel link 35 at its central portion. The parallel link mechanism 35 is mounted to the fixed block 44. A conveying hand system 30 is constituted by the rotatable table 31, the base 32, the linearly movable stage 33, the fixed block 44, the parallel link mechanism 35, the hand locking plate 36, the elastic member 47 and the attracting hand 44. The wafer 45 is attracted by the attracting hand 44. A wafer cassette (wafer accommodating portion) 38 contains the wafer 45 and is fixed on a cassette table 37. An abutting rod 39 has a roller 50 rotatable about a rotational axis parallel to the Z axis. When the wafer 45 attracted on the attracting hand 44 comes to a position immediately before the wafer cassette 38, the abutting rod 39 abuts the roller 50 to the hand locking plate 36 to correct the attitude thereof. The abutting rod 39 is guided by a linear guide 41 in the Y axis direction (up and down direction in the Figure). The guide 41 is mounted on the mounting plate 40. To the mounting plate 40, the cassette table 37 is also fixed. The abutting rod 39 is advanced by an eccentric cam 43 through a predetermined distance in the Y axis direction, and the eccentric cam 43 is driven by an actuator 42. The apparatus further includes a photosensor 46, an electromagnetic valve 48 for driving and controlling the actuator 42, and a CPU 49 for controlling the electromagnetic valve 48 in response to an output of the photosensor 46. The photosensor 46 detects when the wafer attracted on the attracting hand 34 comes to a position immediately before the wafer cassette 38.

Next, the operation will be described as to when the wafer 45 is returned into the wafer cassette 38. A unit 30 containing the wafer attracting hand 4 attracting a wafer 45 which has been subjected to a pattern exposure operation in an unshown exposure apparatus is rotated by the rotatable table 31 to the wafer returning side wherein it faces the wafer cassette 38. Then, the linear stage 33 is driven to move the wafer 45 attracted on the attracting hand 34 to a position immediately before the wafer cassette 38 (the abutting rod 39 operating position) where it is stopped. At this time, the light to the photosensor 46 on the base 32 is blocked. In response to the light blocking in the photosensor 46, the CPU 49 instructs the actuator 42 to raise the abutting rod 39 to a predetermined level along the Y axis.

By the rising of the abutting rod 39, the hand locking plate 36 is moved upwardly. By this, the three pins on the hand locking plate 36 raises the attracting hand 34, by which the wafer attracting surface of the attracting hand 34 is corrected so that the attitude of the wafer 45 is corrected to be substantially parallel to the X-Z plane. Then, the linear stage 33 is driven in the Z axis direction, by which the hand locking plate 36 rollingly moves on the roller 50 of the abutting rod 39, while it is maintained at an upper level by the abutting rod 39. Therefore, the wafer 45 can be accommodated into the wafer cassette 38 without contacting the accommodating shelf 51 (FIG. 4) or the like of the wafer cassette 38. The wafer cassette 38 is movable substantially vertically (Y axis direction) by an unshown mechanism.

The operation for picking the wafer 45 out of the wafer cassette 38 is similar to the wafer returning operation. Immediately before the wafer cassette 38, the attitude of the attracting hand 34 is corrected, and then, it is inserted into the wafer cassette 38 to the accommodating position by the linear stage 33. The wafer 45 is then attracted by a known fashion and it is taken out.

Figure 4:
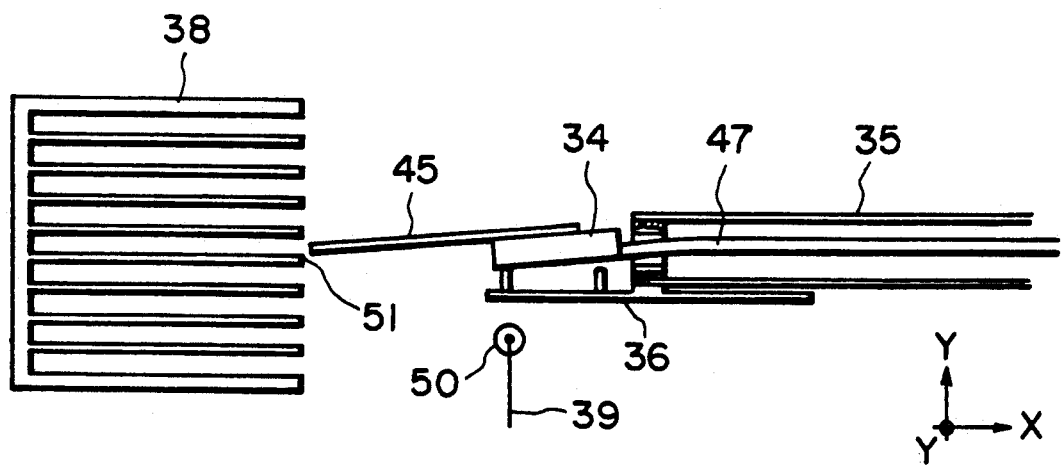
FIG. 4 is a side view of the apparatus of the FIG. 3 embodiment immediately before the attitude correction of the attracting hand.
Figure 5:
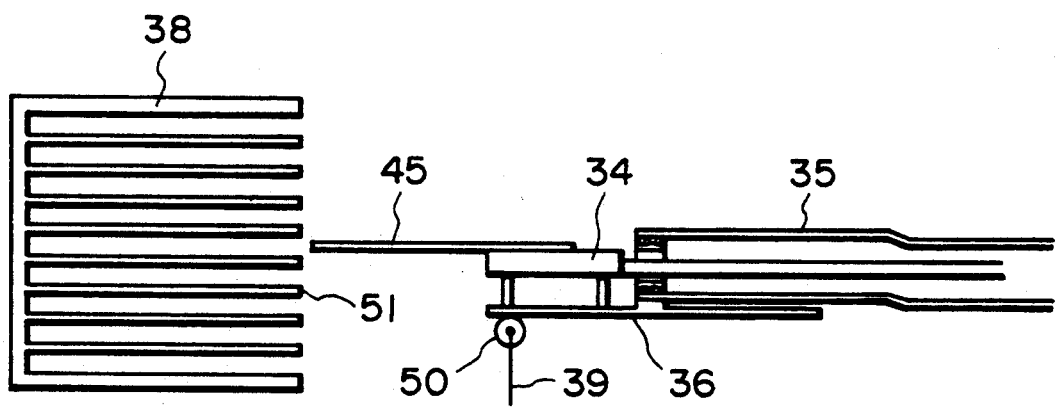
FIG. 5 is a side view of the apparatus of the FIG. 3 embodiment immediately after the attitude correction of the attracting hand.
Figure 6:
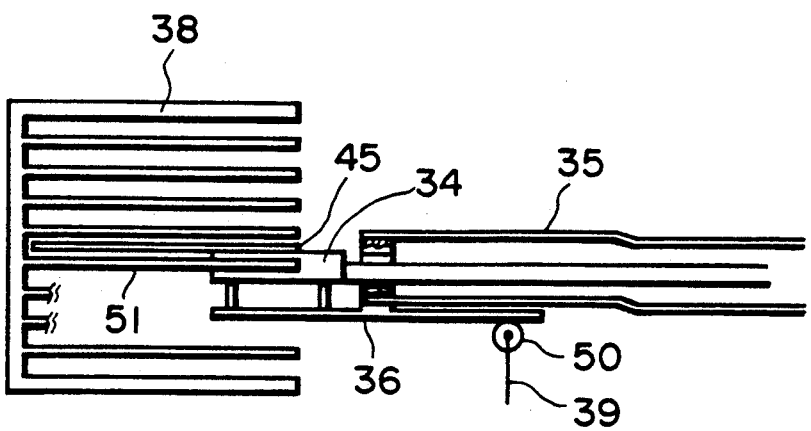
FIG. 6 is a side view of the apparatus of the FIG. 3 embodiment when the attracting hand is inserted into the wafer cassette after the attitude correction.

FIGS. 4, 5 and 6 are side views of the apparatus, which show the wafer 45 returning operation into the wafer cassette 38 in more detail. Referring to these Figures, the relation among the attracting hand 34, the parallel link mechanism 35, the hand locking plate 36 and the abutting rod 39 is shown.

In FIG. 4, the wafer 45 is moved by the linear stage 33 to a position immediately before the wafer cassette 38 and is stopped there. The attracting hand 34 supported on the elastic member 47 is flexed, and if the wafer is inserted into the wafer cassette as it is, the wafer 45 and the attracting hand 34 are contacted to the accommodating shelf 51, or the like, of the wafer cassette 38.

FIG. 5 shows the state wherein the abutting rod 39 is raised by the actuator 42 through a predetermined distance and presses up the hand locking plate 36. The attracting hand 34 is raised by the pins on the locking plate 36, and the attitude thereof is parallel to the attitude initially set by the parallel link 35. The wafer accommodating shelf 51 of the wafer cassette 38 is preadjusted so as to be parallel to the attitude of the wafer 45 (after correction) when it is urged upwardly.

FIG. 6 shows the state wherein the attracting hand 34 is moved horizontally by the linear stage 33 from the state shown in FIG. 5. The abutting rod 39 continues to urge the hand locking plate 36 upwardly, and therefore, the wafer 45 is inserted into the wafer cassette 38 with the attitude thereof being corrected. Therefore, the wafer 45 and the accommodating shelf 51 of the wafer cassette 38 are not contacted.

According to this embodiment, the attitude of the wafer is corrected immediately before the wafer cassette 38 by the attitude correcting mechanism mounted to the mounting plate 40 to which the cassette table 37 is also mounted. Therefore, the positioning error is smaller, even when compared with the case where the supporting member 47 for the attracting hand 34 is highly rigid, for example. Thus, the wafer 45 can be transferred to and from the wafer cassette 38 without contact thereto.

As described in the foregoing, according to this embodiment, the attitude correcting means is disposed between the substrate accommodating portion and the conveying hand, and therefore, any possible dust production attributable to the contact between the substrate or the like and the accommodating portion can be prevented when the substrate such as a wafer is transferred to and from the accommodating portion. In addition, the substrate transfer to and from the accommodating portion can be performed with high precision. In addition, since the structure is simple, assembly is easy, and the cost is low.

While the invention has been described with reference to the structures disclosed herein, it is not confined to the details set forth and this application is intended to cover such modifications or changes as may come within the purposes of the improvements or the scope of the following claims.

What is claimed is:

1. A substrate conveying apparatus comprising:
   a chuck mechanism having a substrate holding surface for chucking a substrate;
   a stage mechanism movable in a direction substantially perpendicular to the substrate holding surface, said stage mechanism including a driving mechanism;
   a supporting mechanism mounted on said stage mechanism and integrally movable with said stage mechanism upon actuation of said driving mechanism;
   a first rotational shaft rotatably mounted on said supporting mechanism and extending in a first direction substantially parallel to the substrate holding surface;
   a supporting hand, attached to said first rotational shaft, freely rotatable about said first rotational shaft;
   a second rotational shaft rotatably mounted on said supporting hand and extending in a second direction, different from the first direction, substantially parallel to the substrate holding surface; and
   an operating hand, attached to said second rotational shaft and freely rotatable about said second shaft relative to said supporting hand, for rotating the substrate, upon actuation of said driving mechanism, to position the substrate against the substrate holding surface when the substrate is received by said chuck mechanism.

2. An apparatus according to claim 1, wherein said first and second rotational shafts are positioned in a plane substantially parallel to the substrate holding surface.

3. An apparatus according to claim 2, wherein said supporting mechanism comprises a parallel link mechanism for moving, relative to said stage mechanism, a portion of said apparatus on which said first rotational shaft is mounted, in a direction of movement of said stage mechanism.

4. An apparatus according to claim 3, wherein the substrate holding surface is arranged in a substantially vertical direction, and said stage mechanism is movable in a horizontal plane.

5. An apparatus according to claim 1, wherein said chuck has a central portion, the holding surface has a projection extending from the central portion of said chuck along said first rotational shaft, and said second rotational shaft crosses the projection when said chuck receives the substrate from said operating hand.

6. An apparatus according to claim 5, wherein the substrate holding surface is arranged in a substantially vertical direction, and said stage mechanism is movable in a horizontal plane.

7. An apparatus according to claim 6, wherein said first rotational shaft extends in a substantially horizontally direction, and said second rotational shaft extends in a substantially vertical direction.

8. A substrate conveying apparatus comprising:
a chuck mechanism having a substrate holding surface for chucking a substrate;
a stage mechanism movable in a direction substantially perpendicular to the substrate holding surface, said stage mechanism including a driving mechanism for driving said stage mechanism;
a supporting mechanism mounted on said stage mechanism and integrally movable with said stage mechanism upon actuation by said driving mechanism;
a rotational shaft rotatably mounted on said supporting mechanism and extending in a predetermined direction substantially parallel to the substrate holding surface, said rotational shaft being rotated upon actuation by said driving mechanism; and
an operating hand for rotating the substrate, said operating hand being attached to said rotational shaft and universally rotatable about said rotatable rotational shaft and about spaced orthogonal axes, upon actuation by said driving mechanism, to position the substrate against the substrate holding surface when the substrate is received by said chuck mechanism.

9. A semiconductor device manufacturing system including a wafer conveying apparatus, said wafer conveying apparatus comprising:

a chuck mechanism having a wafer holding surface for chucking a wafer;
a stage mechanism movable in a direction substantially perpendicular to the wafer holding surface, said stage mechanism including a driving mechanism;
a supporting mechanism mounted on said stage mechanism and integrally movable with said stage mechanism;
a first rotational shaft rotatably mounted on said supporting mechanism and extending in a first direction substantially parallel to the wafer holding surface;
a supporting hand, attached to said first rotational shaft, freely rotatable about said first rotational shaft;
a second rotational shaft rotatably mounted on said supporting hand and extending in a second direction, different from the first direction, substantially parallel to the wafer holding surface; and
an operating hand, attached to said second rotational shaft and freely rotatable about said second shaft relative to said supporting hand, for rotating the wafer, upon actuation of said driving mechanism, to position the substrate against the wafer holding surface when the wafer is received by said chuck mechanism.

* * * * *

UNITED STATES PATENT AND TRADEMARK OFFICE
CERTIFICATE OF CORRECTION

PATENT NO. : 5,277,539
DATED : January 11, 1994
INVENTOR(S) : SHIN MATSUI, ET AL.

It is certified that error appears in the above-indentified patent and that said Letters Patent is hereby corrected as shown below:

COLUMN 1:

Line 50, "conveying," should read --conveying--.

COLUMN 2:

Line 14, "deviation:" should read --deviation.--;
Line 18, "desired: however," should read --desired. However,--; and
Line 61, "is" should be deleted.

COLUMN 6:

Line 54, "hand 4" should read --hand 34--.

COLUMN 8:

Line 67, "tally" should read --tal--.

Signed and Sealed this

Fifth Day of July, 1994

Attest:

BRUCE LEHMAN

Attesting Officer     Commissioner of Patents and Trademarks